(12) United States Patent
Sato et al.

(10) Patent No.: US 7,528,402 B2
(45) Date of Patent: May 5, 2009

(54) ELECTRICALLY REWRITABLE NON-VOLATILE MEMORY ELEMENT

(75) Inventors: Homare Sato, Tokyo (JP); Kiyoshi Nakai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 43 days.

(21) Appl. No.: 11/594,879

(22) Filed: Nov. 9, 2006

(65) Prior Publication Data

US 2007/0114510 A1 May 24, 2007

(30) Foreign Application Priority Data

Nov. 19, 2005  (JP)  ............................. 2005-335069

(51) Int. Cl.
*H01L 47/00* (2006.01)

(52) U.S. Cl. .................... 257/5; 257/209; 257/315; 257/E45.002

(58) Field of Classification Search ............ 257/315, 257/209, 204, 205, 206, 211, 5, E45.002
See application file for complete search history.

(56) References Cited

U.S. PATENT DOCUMENTS

2003/0146469 A1* 8/2003 Matsuoka et al. .......... 257/328

2004/0012009 A1 1/2004 Casagrande et al.

OTHER PUBLICATIONS

E. Varesi et al., "Advances in Phase Change Memory Technology," EPCOS (European Symposium Phase Change and Ovonic Science) 2004 Conf. Proceedings.
S. Hudgens and B. Johnson, "Overview of Phase-Change Chalcogenide Nonvolatile Memory Technology," MRS Bulletin, Nov. 2004.

* cited by examiner

*Primary Examiner*—Sue A. Purvis
*Assistant Examiner*—Tucker Wright
(74) *Attorney, Agent, or Firm*—McDermott Will & Emery LLP

(57) ABSTRACT

A non-volatile semiconductor memory device includes a plurality of lower electrodes arranged in a matrix manner, a plurality of recording layer patterns, each being arranged on the lower electrode, that contain a phase change material, and an interlayer insulation film that is provided between the lower electrode and the recording layer pattern and that has a plurality of apertures for exposing one portion of the lower electrode. The lower electrode and the recording layer pattern are connected in each aperture. The apertures extend in the X direction in parallel to one another. The recording layer patterns extend in the Y direction in parallel to one another. Thus the aperture can be formed with higher accuracy as compared to forming an independent aperture. Accordingly, high heating efficiency can be obtained while effectively preventing occurrence of poor connection or the like.

7 Claims, 12 Drawing Sheets

ELECTRICALLY REWRITABLE NON-VOLATILE MEMORY ELEMENT

TECHNICAL FIELD

The present invention relates to an electrically rewritable non-volatile memory element. More specifically, the present invention relates to an electrically rewritable non-volatile memory element having a recording layer that includes phase change material.

BACKGROUND OF THE INVENTION

Personal computers and servers and the like use a hierarchy of memory devices. There is lower-tier memory, which is inexpensive and provides high storage capacity, while memory higher up the hierarchy provides high-speed operation. The bottom tier generally consists of magnetic storage such as hard disks and magnetic tape. In addition to being non-volatile, magnetic storage is an inexpensive way of storing much larger quantities of information than solid-state devices such as semiconductor memory. However, semiconductor memory is much faster and can access stored data randomly, in contrast to the sequential access operation of magnetic storage devices. For these reasons, magnetic storage is generally used to store programs and archival information and the like, and, when required, this information is transferred to main system memory devices higher up in the hierarchy.

Main memory generally uses dynamic random access memory (DRAM) devices, which operate at much higher speeds than magnetic storage and, on a per-bit basis, are cheaper than faster semiconductor memory devices such as static random access memory (SRAM) devices.

Occupying the very top tier of the memory hierarchy is the internal cache memory of the system microprocessor unit (MPU). The internal cache is extremely high-speed memory connected to the MPU core via internal bus lines. The cache memory has a very small capacity. In some cases, secondary and even tertiary cache memory devices are used between the internal cache and main memory.

DRAM is used for main memory because it offers a good balance between speed and bit cost. Moreover, there are now some semiconductor memory devices that have a large capacity. In recent years, memory chips have been developed with capacities that exceed one gigabits. DRAM is volatile memory that loses stored data if its power supply is turned off. That makes DRAM unsuitable for the storage of programs and archival information. Also, even when the power supply is turned on, the device has to periodically perform refresh operations in order to retain stored data, so there are limits as to how much device electrical power consumption can be reduced, while yet a further problem is the complexity of the controls run under the controller.

Semiconductor flash memory is high capacity and non-volatile, but requires high current for writing and erasing data operations, and these operation times are long. These drawbacks make flash memory an unsuitable candidate for replacing DRAM in main memory applications. There are other non-volatile memory devices, such as magnetoresistive random access memory (MRAM) and ferroelectric random access memory (FRAM), but they cannot easily achieve the kind of storage capacities that are possible with DRAM.

Another type of semiconductor memory that is being looked to as a possible substitute for DRAM is phase change random access memory (PRAM), which uses phase change material to store data. In a PRAM device, the storage of data is based on the phase state of phase change material contained in the recording layer. Specifically, there is a big difference between the electrical resistivity of the material in the crystalline state and the electrical resistivity in the amorphous state, and that difference can be utilized to store data.

This phase change is effected by the phase change material being heated when a write current is applied. Data is read by applying a read current to the material and measuring the resistance. The read current is set at a level that is low enough not to cause a phase change. Thus, the phase does not change unless the material is heated to a high temperature, so data is retained even when the power supply is switched off.

In order to effectively heat a phase change material by a write current, it is preferable to reduce a contact area between a lower electrode, which functions as a heater plug, and a recording layer, thereby reducing a heating region. To realize this, there is proposed a method in which an interlayer insulation film is arranged between the lower electrode of which top surface has a ring shape and a recording layer pattern in stripes, and the both are contacted via an aperture provided in the interlayer insulation film. See US 2004/0012009-A1; "Advances in Phase Change Memory Technology," E. Varesi, A. Modelli, P. Besana, T. Marangon, F. Pellizzer, A. Pirovano, R. Bez, EPCOS (European Symposium Phase Change and Ovonic Science) 2004 Conf. Proceedings; and "Overview of Phase-Change Chalcogenide Nonvolatile Memory Technology," S. Hudgens, B. Johnson, MRS Bulletin, November 2004.

According to this method, the recording layer contacts only one portion of the ring-shaped lower electrode, and thus, the heating concentrates in one area. As a result, the heating of the phase change material by the write current is performed effectively, so that a phase change (reset) from a crystalline phase to an amorphous phase that particularly requires a large amount of current can be realized with a smaller amount of current.

FIG. 12 is a schematic plan view of a structure of relevant parts of a conventional non-volatile semiconductor memory device in which a contact area between the lower electrode and a recording layer is reduced. FIG. 13 is a schematic cross section taken along a line C-C shown in FIG. 12.

In the non-volatile semiconductor memory device shown in FIG. 12 and FIG. 13, a lower electrode 2, which functions as a heater plug, has a cylindrical shape. Thus, the plane shape of a top surface 2a has a ring shape. A bottom surface 2b of the lower electrode 2 is connected to a drain of a transistor (not shown) via a contact plug 4. The top surface 2a of the ring-shaped lower electrode 2 is covered with an interlayer insulation film 6.

The interlayer insulation film 6 is formed with an aperture 6a. In this portion, a region 3, which is one portion of the top surface 2a of the lower electrode 2, is exposed. The aperture 6a is commonly provided to two adjacent lower electrodes 2. The planar position of an edge 6b in a longitudinal direction is positioned in a region surrounded by the ring-shaped lower electrode 2.

A recording layer 8 composed of a phase change material is formed on the interlayer insulation film 6. Thus, the recording layer 8 contacts the top surface 2a of the lower electrode 2 via the aperture 6a, so that the contact area is limited to the area of the region 3 exposed by the aperture 6a. This limitation reduces the contact area. As a result, high heating efficiency can be obtained.

In the non-volatile semiconductor memory device shown in FIG. 12 and FIG. 13, however, one aperture 6a needs be formed for each two lower electrodes 2, which makes it difficult for the aperture 6a to be vertically positioned with the lower electrode. That is, when an independent aperture 6a having an island-like shape is to be formed, it becomes difficult to correctly control the position of the edge 6b. As a result, poor connection or the like easily occurs.

For example, as shown in FIG. 14, when the position of the aperture 6a is deviated from the original position to the right direction, the lower electrode 2 on the left side sometimes does not have any portion exposed by the aperture 6a. In this case, the lower electrode 2 on the left side and the recording layer 8 cannot contact, resulting in poor connection.

The problem of such poor connection can be solved to some extent by setting the length of the aperture 6a to be long. In this case, however, as shown in FIG. 15, when the position of the aperture 6a is deviated from the original position to the right direction, the lower electrode 2 on the right side becomes exposed in two regions by the aperture 6a. In such case, two current paths are formed between the same lower electrode 2 and the recording layer 8, so that a desired property cannot be obtained.

SUMMARY OF THE INVENTION

The present invention has been achieved to solve the above problems. It is therefore an object of the present invention to provide a non-volatile semiconductor memory device that includes a recording layer that contains a phase change material, and that can obtain high heating efficiency while sufficiently securing a process margin.

A non-volatile semiconductor memory device according to one aspect of the present invention comprises:

a plurality of lower electrodes arranged in a matrix manner;

a plurality of recording layer patterns provided on the lower electrode, and containing a phase change material; and an interlayer insulation film having a plurality of apertures for exposing one portion of the lower electrode, the interlayer insulation film being provided between the lower electrode and the recording layer pattern, wherein the lower electrode and the recording layer pattern are connected in the aperture, the apertures extend in parallel to one another in a first direction, and the recording layer patterns extend in parallel to one another in a second direction that intersects with the first direction.

The non-volatile semiconductor memory device according to the present invention includes a plurality of apertures, arranged in an interlayer insulation film and each having a shape that extends in parallel to each other, so that it becomes possible to form the aperture with higher accuracy as compared to a conventional case in which an independent aperture is formed. Therefore, it is possible to obtain high heating efficiency while effectively preventing occurrence of poor connection or the like.

In a preferred embodiment of the present invention, a top surface of the lower electrode includes a strip region that extends in the second direction, and the aperture is formed at a position for exposing at least one portion of the strip region. Accordingly, even when a formation position of the aperture is slightly deviated in the second direction, the contact area between the lower electrode and the recording layer can be made approximately constant, thereby obtaining a stable device property.

When the top surface of the lower electrode has a ring shape, the aperture can be formed at a position for exposing two regions of the top surface of each lower electrode, or at a position for exposing one region of the top surface of each lower electrode. In the former case, the recording layer pattern is preferably formed at a position that contacts only one of the two exposed regions of the lower electrode. On the other hand, in the latter case, the recording layer pattern is preferably formed at a position that contacts only one portion of the exposed regions of the lower electrode. Accordingly, the contact area is further reduced, thereby obtaining higher heating efficiency.

A non-volatile semiconductor memory device according to another aspect of the present invention comprises:

a lower electrode having a ring-shaped top surface;

an interlayer insulation film provided on the lower electrode; and a recording layer arranged on the interlayer insulation film, and containing a phase change material, wherein the interlayer insulation film has an aperture for exposing one portion of the top surface of the lower electrode, the aperture extending in a first direction, and the recording layer extends in a second direction that intersects with the first direction, and contacts a further one portion of the one portion of the top surface of the lower electrode exposed in the aperture.

According to this aspect of the present invention, it is also possible to obtain high heating efficiency while effectively preventing occurrence of poor connection or the like.

A diameter of the top surface of the lower electrode in the second direction is preferably larger than that in the first direction. Accordingly, even when a formation position of the aperture is slightly deviated in the second direction, the contact area between the lower electrode and the recording layer can be made approximately constant, thereby obtaining a stable device property.

As described above, the non-volatile semiconductor memory device according to the present invention can obtain high heating efficiency while preventing occurrence of poor connection or the like. Therefore, it is possible to reduce a larger amount of write current as compared to the conventional case while securing a sufficient process margin. It is also possible to enhance a writing speed.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
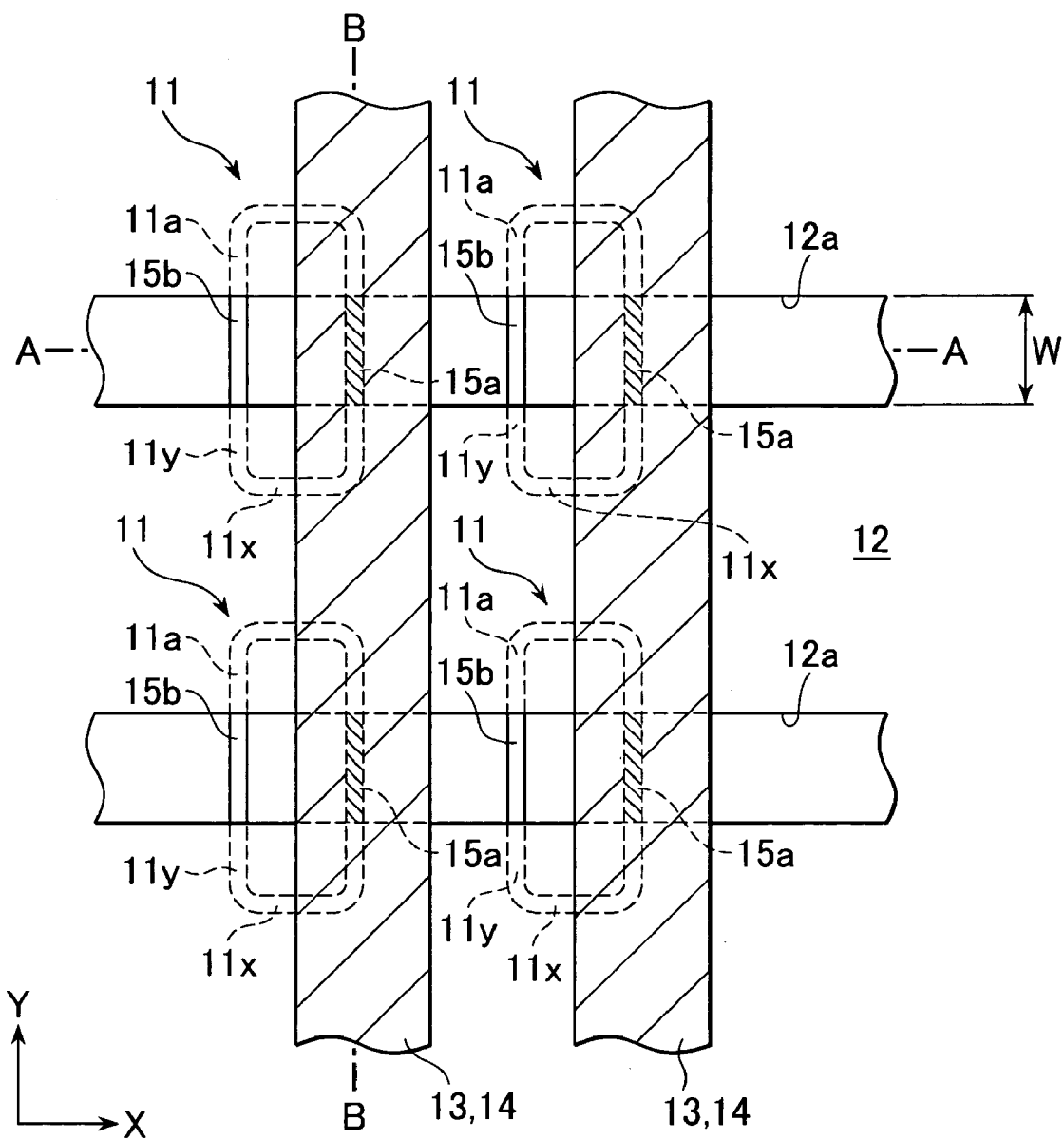
FIG. 1 is a schematic plan view of a structure of relevant parts of a non-volatile semiconductor memory device according to a first preferred embodiment of the present invention.
Figure 2:
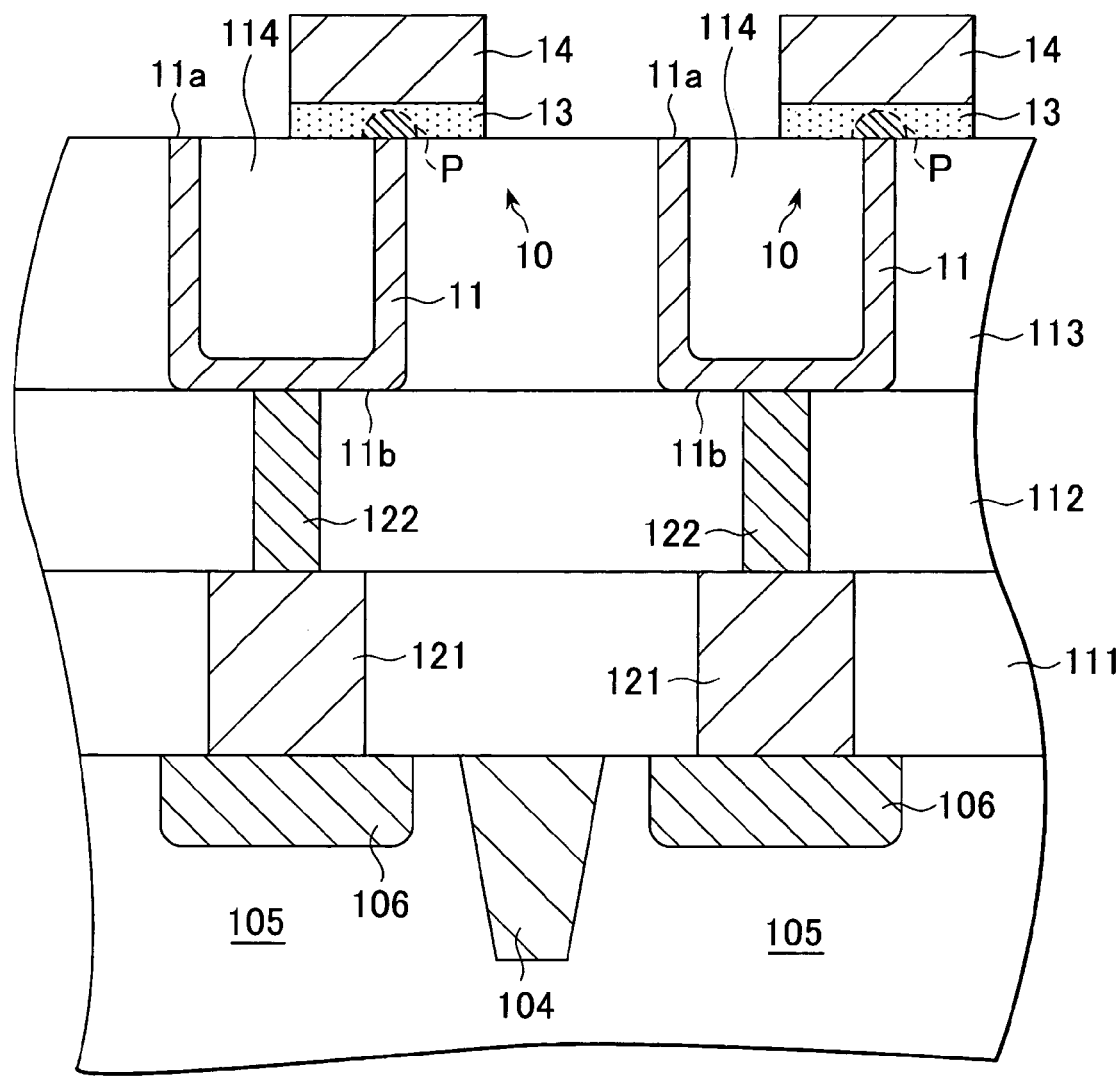
FIG. 2 is a schematic cross section taken along a line A-A shown in FIG. 1.
Figure 3:
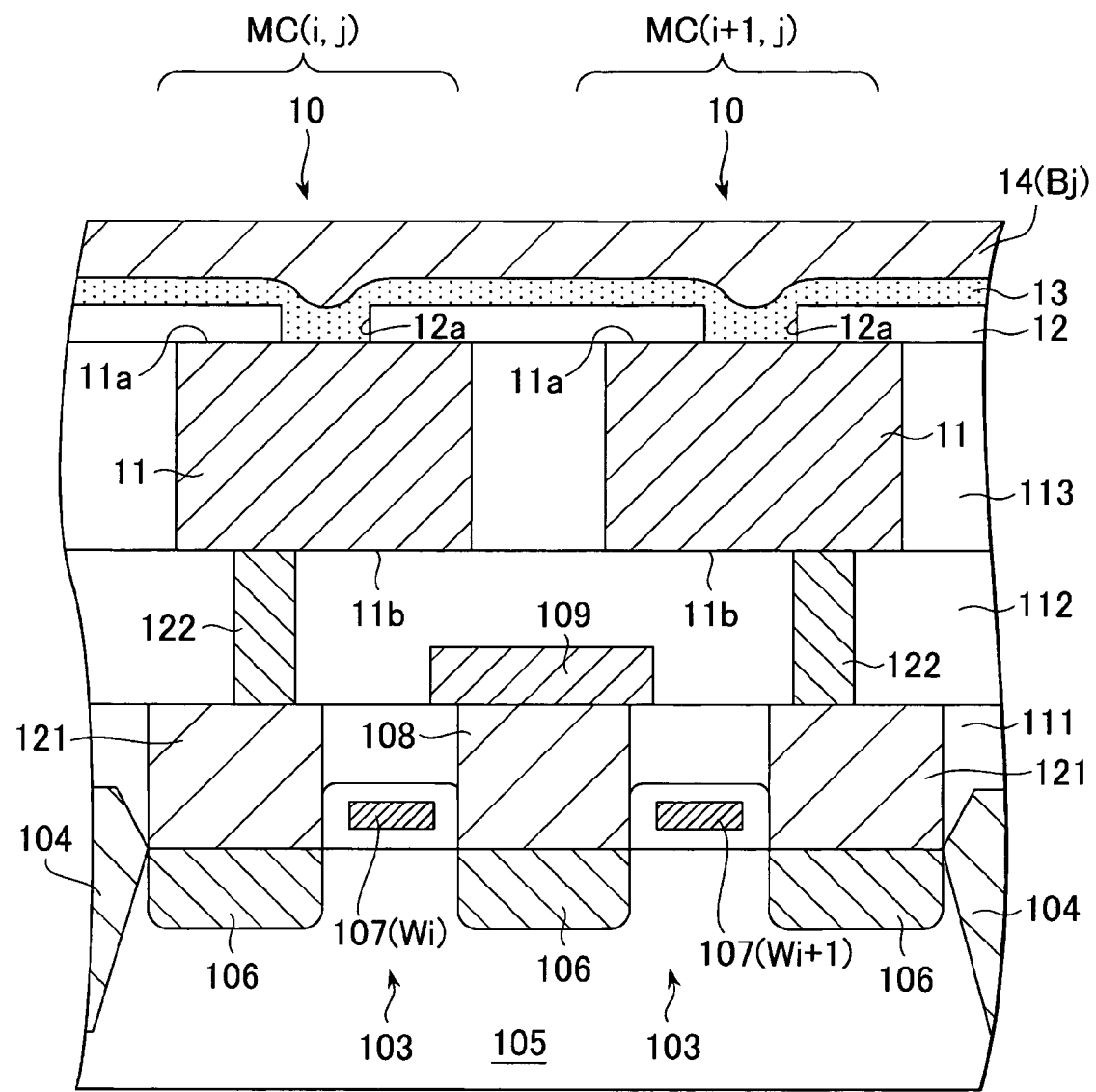
FIG. 3 is a schematic cross section taken along a line B-B shown in FIG. 1.

FIG. 1 is a schematic plan view of a structure of relevant parts of a non-volatile semiconductor memory device according to a first preferred embodiment of the present invention. FIG. 2 is a schematic cross section taken along a line A-A shown in FIG. 1. FIG. 3 is a schematic cross section taken along a line B-B shown in FIG. 1.

As shown in FIG. 1, the non-volatile semiconductor memory device according to this embodiment includes a plurality of lower electrodes 11 arranged in a matrix manner, an interlayer insulation film 12 provided on the lower electrode 11, a recording layer 13 that is arranged on the interlayer insulation film 12 and that contains a phase change material, and an upper electrode 14 laminated on the recording layer 13. A top surface 11a of the lower electrode 11 has a ring shape and has a strip region 11x that extends in an X direction and a strip region 11y that extends in a Y direction, as shown in FIG. 1. In this embodiment, the strip region 11y is longer than the strip region 11x, and the strip region 11y extends approximately linearly. Preferably, the X direction and the Y direction form an angle of approximately 90 degrees therebetween as in this embodiment.

The interlayer insulation film 12 has a plurality of apertures 12a that extend in the X direction. The apertures 12 are formed in parallel to one another. The aperture 12a is formed at a position that traverses the strip region 11y of the lower electrode 11. That is, the aperture 12a is formed at a position sandwiched by the two strip regions 11x. This formation leads to exposure of the top surface 11a of each lower electrode 11 in two regions 15a and 15b that form one portion of the strip region 11y.

The recording layer 13 and the upper electrode 14 extend in the Y direction. These members are formed in parallel to each other. The recording layer 13 and the upper electrode 14 are formed on one of the strip regions 11y (right side in FIG. 1), out of the two strip regions 11y of the lower electrode 11. Thus, in the lower electrode 11, the region 15a alone on one side (right side in FIG. 1) contacts the recording layer 13, out of the two regions 15a and 15b exposed in the aperture 12a. On the other hand, the region 15b (left side in FIG. 1) does not contact the recording layer 13.

Each constituent element of the non-volatile semiconductor memory device according to this embodiment will be described in more detail.

The lower electrode 11 is used as a heater plug. That is, the lower electrode 11 forms a portion of a heating element at the time of data writing. For this reason, examples of materials used for the lower electrode 11 preferably include a material having relatively high electric resistance such as metal silicide, metal nitride, and nitride composed of metal silicide. Examples are not restrictive, but preferably include high-melting metals such as W, TiN, TaN, WN, and TiAlN, nitride composed thereof, and nitride composed of high-melting metal silicide such as TiSiN and WSiN. Materials such as TiCN are further preferably used.

As shown in FIG. 2 and FIG. 3, the lower electrode 11 is embedded in an interlayer insulation film 113, and a steric shape of the lower electrode 11 is cylindrical. The region surrounded by the cylindrical lower electrode 11 is filled with an insulation material 114. The interlayer insulation film 113 and the insulation material 114 are preferably composed of the same material.

A bottom surface 11b of the lower electrode 11 is connected to a diffusion region 106 (drain) formed in an active region 105 via contact plugs 122 and 121. The contact plug 121 is embedded in an interlayer insulation film 111, and the contact plug 122 is embedded in an interlayer insulation film 112.

As shown in FIG. 3, one active region 105 defined by an element isolation region 104 is formed with three diffusion regions 106. A gate electrode 107 is arranged on a substrate between the diffusion regions 106. This forms two transistors 103 in one active region 105. Sources of the two transistors 103 are common, and are connected to a ground wiring 109 via a contact plug 108 provided in the interlayer insulation film 111.

The interlayer insulation film 12 functions to separate the lower electrode 11 and the recording layer 13. A silicon oxide film, silicon nitride film, and the like can be used as materials for forming the interlayer insulation film 12. Although not particularly limit, materials of which etching rates vary with one another is preferably used as the materials of the interlayer insulation film 12, and those of the interlayer insulation film 113 and the insulation material 114. For example, when the silicone oxide film is used as the material for the interlayer insulation film 113 and the insulation material 114, the silicone nitride film is preferably used as the material for the interlayer insulation film 12.

Although not particularly limited, the film thickness of the interlayer insulation film 12 can be set to approximately 40 nm, for example. The width of the aperture 12a formed in the interlayer insulation film 12 is not particularly limited as long as it is smaller than the length of the lower electrode 11 in the Y direction. As one example, when the length of the lower electrode 11 in the Y direction is 200 nm, the width of the aperture 12a can be set to approximately 80 nm.

A width W of the aperture 12a is preferably as small as possible. This is because the smaller the width W of the aperture 12a is set, the smaller a contact area of the lower electrode 11 and the recording layer 13. As a result, heating efficiency can be enhanced. In this embodiment, since the aperture 12a has a successive shape that extends in the X direction, an aperture can be formed with higher accuracy as compared to a conventional island-like aperture. Accordingly, the width W of the aperture 12a can be made sufficiently thin.

The recording layer 13 is composed of a phase change material. The phase change material constituting the recording layer 13 is not particularly limited insofar as the material assumes two or more phase states and has an electrical resistance that changes according to the phase state. A so-called chalcogenide material is preferably selected. A chalcogenide material is defined as an alloy that contains at least one or more elements selected from the group consisting of germanium (Ge), antimony (Sb), tellurium (Te), indium (In), selenium (Se), and the like. Examples include GaSb, InSb, InSe, $Sb_2Te_3$, GeTe, and other binary-based elements; $Ge_2Sb_2Te_5$, InSbTe, GaSeTe, $SnSb_2Te_4$, InSbGe, and other tertiary-based elements; and AgInSbTe, (GeSn)SbTe, GeSb(SeTe), $Te_{81}Ge_{15}Sb_2S_2$, and other quaternary-based elements.

A phase change material that includes a chalcogenide material may assume any phase state including an amorphous phase (non-crystalline phase) and a crystalline phase, with a relatively high-resistance state occurring in the amorphous phase, and a relatively low-resistance state occurring in the crystalline phase.

Figure 4:
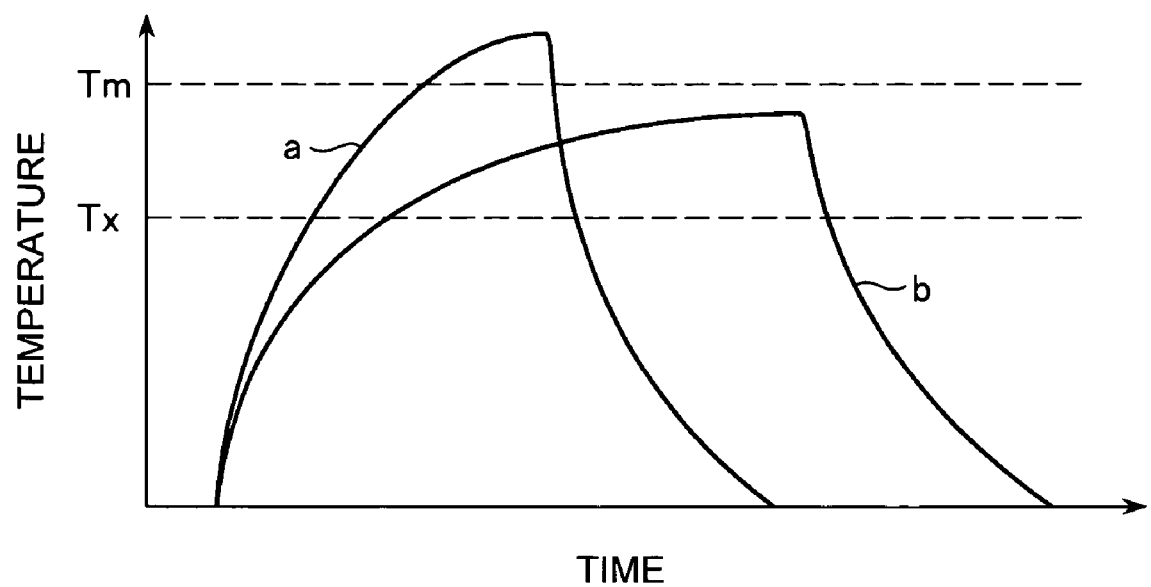
FIG. 4 is a graph showing the method for controlling the phase state of the phase change material that includes a chalcogenide material.

FIG. 4 is a graph showing the method for controlling the phase state of the phase change material that includes a chalcogenide material.

In order to place the phase change material that includes a chalcogenide material in the amorphous state, the material is cooled rapidly after being heated to a temperature equal to or higher than the melting point Tm, as indicated by the curve a in FIG. 4. In order to place the phase change material that includes a chalcogenide material in the crystalline state, the material is cooled slowly after being heated to a temperature at or above the crystallization temperature Tx and lower than the melting point Tm, as indicated by the curve b in FIG. 4. Heating may be performed by applying an electric current. The temperature during heating may be controlled according to the amount of applied current, i.e., the current application time or the amount of current per unit time.

When a write current is passed to the recording layer 13, a portion immediately above the lower electrode 11 is heated, among the recording layer 13. That is, by passing a write current to the recording layer 13, the phase state of the chalcogenide material in a phase change region P shown in FIG. 2 can be changed. The film thickness of the recording layer 13 is not particularly limited, but is preferably set to about 100 nm. The width of the recording layer 13 (width in the X direction) is not particularly limited, but can be set to about 300 nm as one example.

The upper electrode 14 also serves as a bit line. Examples of materials used for the upper electrode 14 are selected from metallic materials having lower electric resistance. Materials preferably used therefor include aluminum (Al), titanium (Ti), tungsten (W), an alloy thereof, nitride thereof, and silicide, for example. More specifically, examples include W, WN, and TiN. The film thickness of the upper electrode 14 is not particularly limited, but is preferably set to approximately 60 nm. The upper electrode 14 has the same pattern as the recording layer 13. Therefore, the width of the upper electrode 14 agrees with the width of the recording layer 13.

Figure 5:
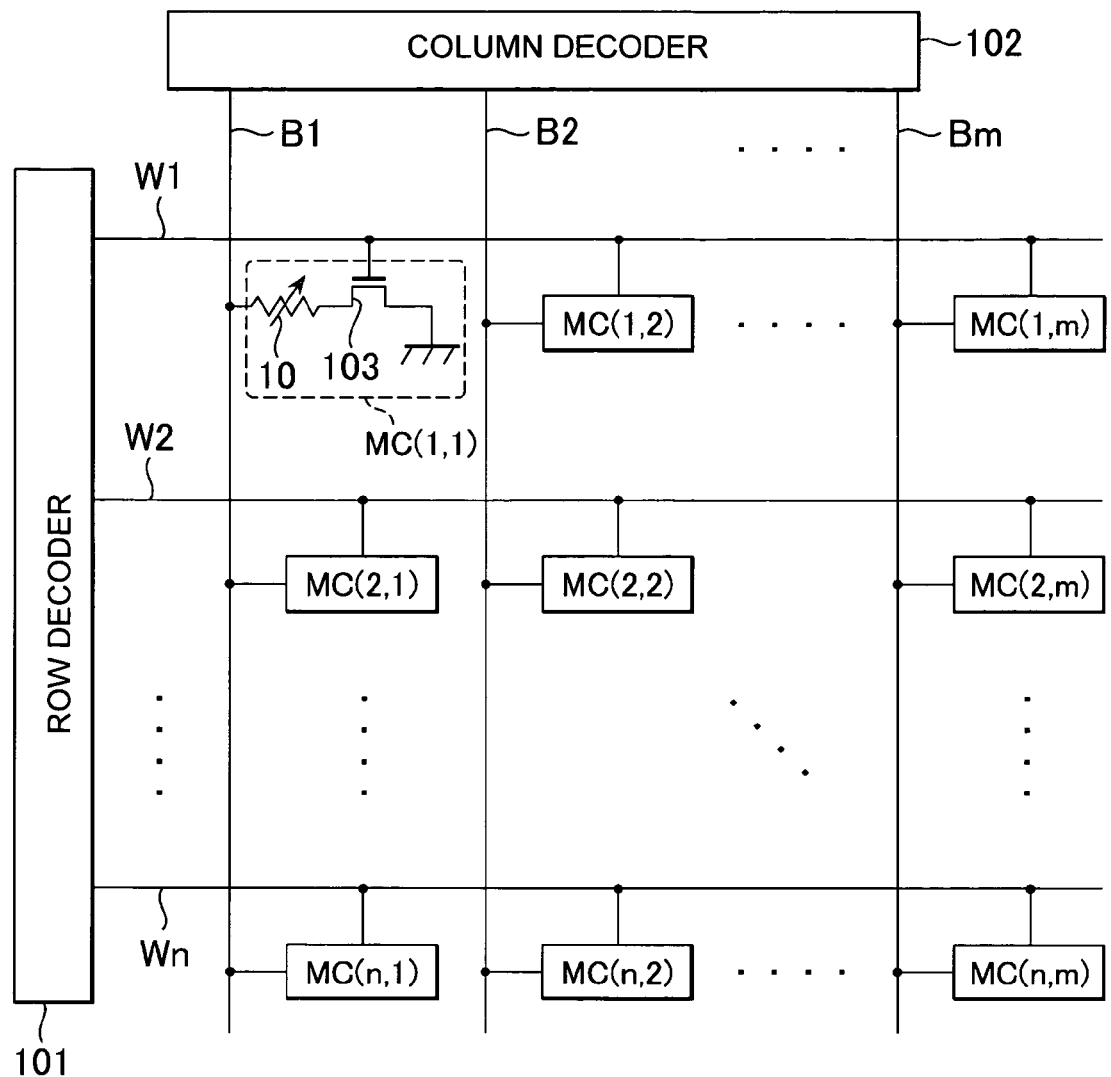
FIG. 5 is a circuit diagram of the non-volatile semiconductor memory device according to the first embodiment of the present invention.

FIG. 5 is a circuit diagram of the non-volatile semiconductor memory device according to this embodiment.

The non-volatile semiconductor storage device shown in FIG. 5 is provided with n word lines W1-Wn, m bit lines B1-Bm, and memory cells MC(1, 1)-MC(n, m) disposed at the intersections of the word lines and the bit lines. The word lines W1-Wn are connected to a row decoder 101, and the bit lines B1-Bm are connected to a column decoder 102. The memory cells MC are composed of a non-volatile memory element 10 and a transistor 103 connected in series between a ground and the corresponding bit line. The control terminal of the transistor 103 is connected to the corresponding word line.

The non-volatile memory element 10 has a configuration in which the recording layer 13 is connected between the lower electrode 11 and the upper electrode 14, as shown in FIG. 2 and FIG. 3. Accordingly, the upper electrode 14 of the non-volatile memory element 10 is used as a corresponding bit line, and the lower electrode 11 is connected to the corresponding transistor 103. FIG. 3 shows two memory cells MC (i, j) and MC (i+1, j). The two memory cells commonly use a corresponding bit line Bj, and are connected to adjacent word lines Wi and Wi+1.

The non-volatile semiconductor storage device having this type of configuration can perform writing and reading of data by activating any of the word lines W1-Wn through the use of the row decoder 101, and allowing a current to flow to at least one of the bit lines B1-Bm in this state. In other words, in a memory cell in which the corresponding word line is activated, the transistor 103 is ON, and the corresponding bit line is then connected to the ground via the non-volatile memory element 10. Accordingly, by allowing a write current to flow to the bit line selected by a prescribed column decoder 102 in this state, a phase change can be effected in the recording layer 13 included in the non-volatile memory element 10.

Specifically, by allowing a prescribed amount of current to flow, the phase change material constituting the recording layer 13 is placed in the amorphous phase by heating the phase change material to a temperature equal to or higher than the melting point Tm shown in FIG. 4, and then rapidly interrupting the current to cause rapid cooling. By allowing an amount of current to flow that is smaller than the above-mentioned prescribed amount, the phase change material constituting the recording layer 13 is placed in the crystalline phase by heating the phase change material to a temperature equal to or higher than the crystallization temperature Tx and less than the melting point Tm shown in FIG. 4, and then gradually reducing the current to cause gradual cooling in order to facilitate crystal growth.

Also in the case of reading data, any one of the word lines W1-Wn is activated by the row decoder 101, and while in this state, a read current is allowed to flow to at least one of the bit lines B1-Bm. Since the resistance value is high for a memory cell in which the recording layer 13 is in the amorphous phase, and the resistance value is low for a memory cell in which the recording layer 13 is in the crystalline phase, the phase state of the recording layer 13 can be ascertained by detecting these values using a sense amplifier (not shown).

The phase state of the recording layer 13 can be correlated with a stored logical value. For example, defining an amorphous phase state as "0" and a crystalline phase state as "1" makes it possible for a single memory cell to retain 1-bit data. The crystallization ratio can also be controlled in multi-stage or linear fashion by adjusting the time for which the recording layer 13 is maintained at the temperature equal to or higher than the crystallization temperature Tx and less than the melting point Tm when a change occurs from the amorphous phase to the crystalline phase. Performing multi-stage control of the mixture ratio of amorphous states and crystalline states by this type of method makes it possible for 2-bit or higher order data to be stored in a single memory cell. Furthermore, performing linear control of the mixture ratio of amorphous states and crystalline states makes it possible to store analog values.

The method for manufacturing the non-volatile semiconductor memory device according to the present embodiment will next be described.

Figure 6:
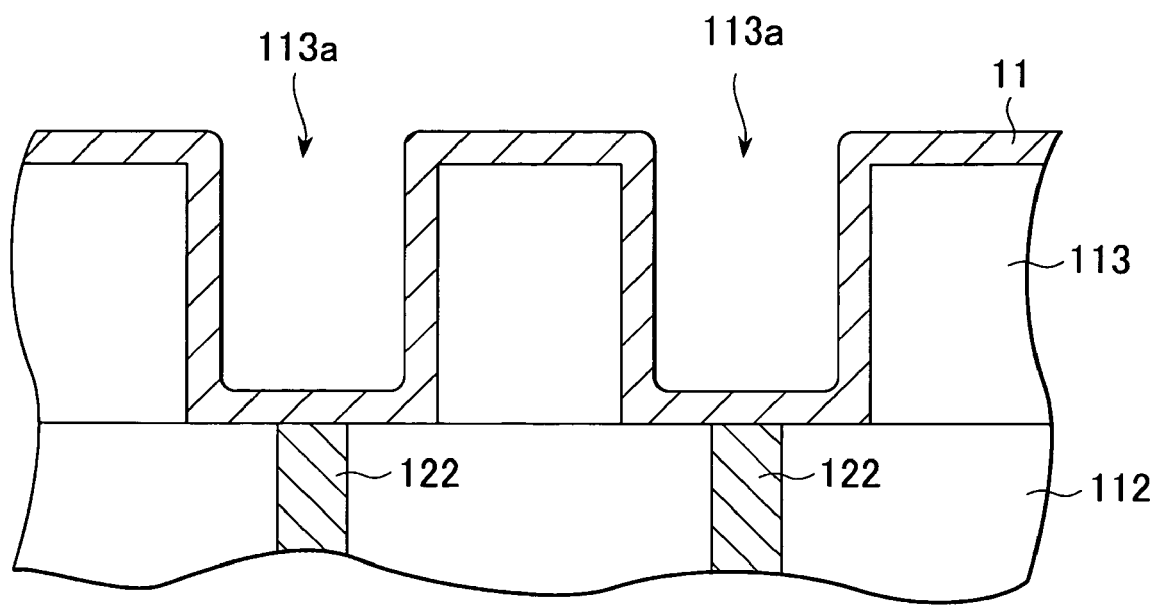
FIG. 6 is a process diagram showing a process of forming a through-hole to a lower electrode.
Figure 7:
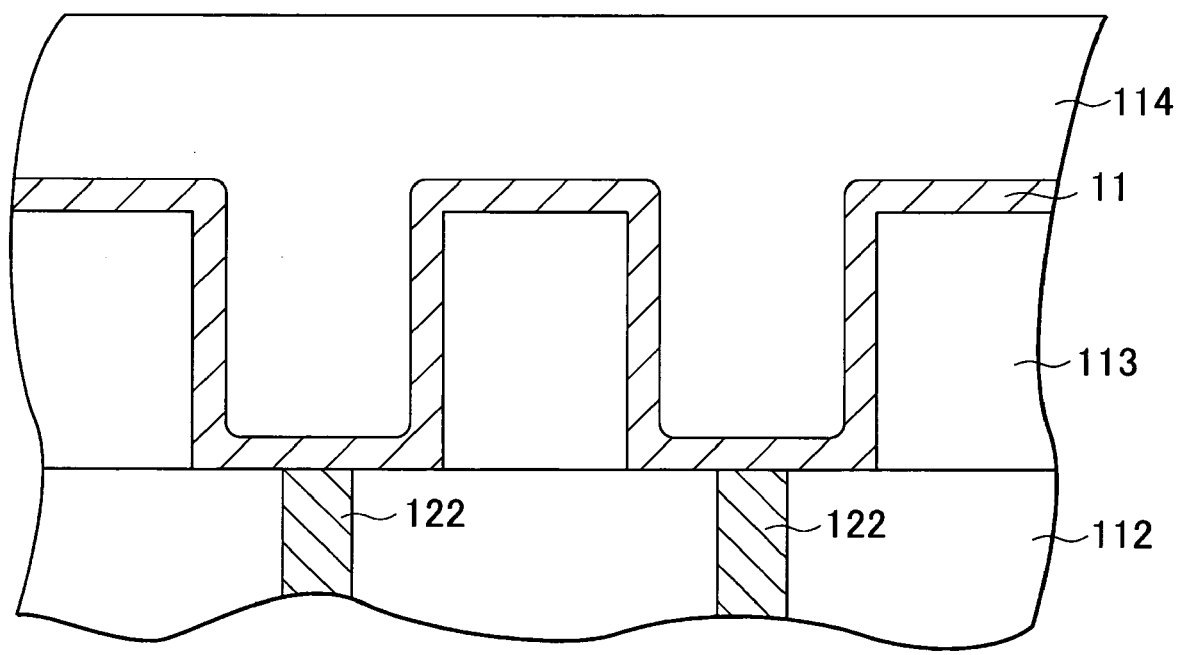
FIG. 7 is a process diagram showing a process of forming an insulation material.
Figure 8:
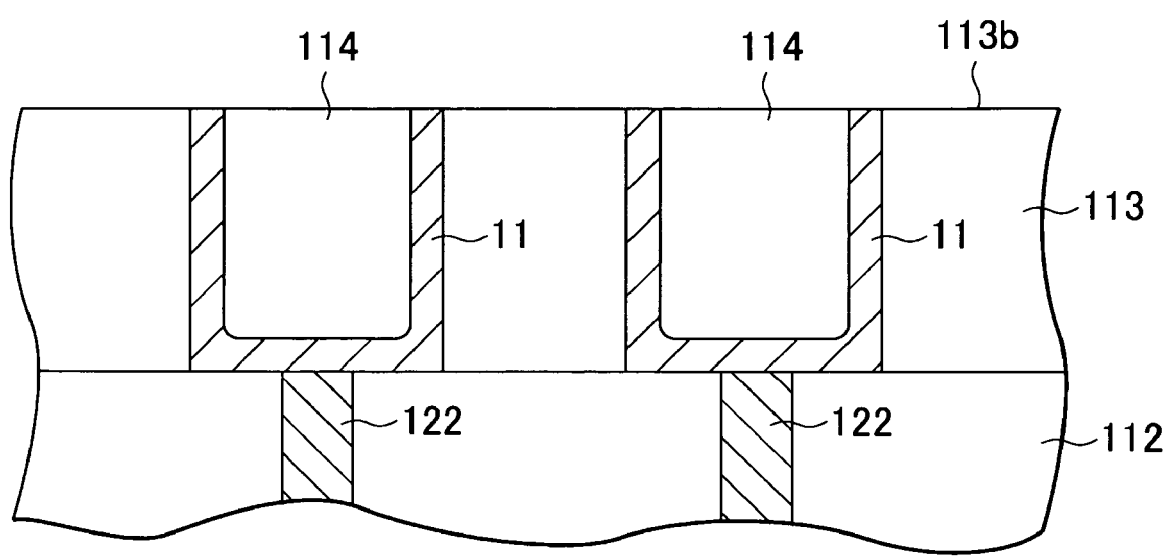
FIG. 8 is a process diagram showing a process of etched back or polishing the insulation material.

FIG. 6 to FIG. 9 are process diagrams sequentially showing manufacturing steps of the non-volatile semiconductor memory device according to this embodiment. FIG. 6 to FIG. 8 show a cross section that corresponds to line A-A shown in FIG. 1. In the cross sections, in order to simplify the drawings, portions that relate to the transistor 103 are omitted.

Firstly, after the contact plug 122 is embedded into the interlayer insulation film 112, the interlayer insulation film 113 is formed on the entire surface, as shown in FIG. 6. A through-hole 113a is then formed in the interlayer insulation film 113. The through-hole 113a needs be formed at the position where the contact plug 122 is exposed in the bottom portion of the through-hole 113a. Next, the lower electrode 11 is formed in an inner wall portion of the through-hole 113a by using a film formation method having good step coverage. Examples of the film formation method having good step coverage include CVD.

Next, as shown in FIG. 7, the insulation material 114 is formed on the entire surface, thereby completely filling the through-hole 113a. As described above, as the material of the insulation material 114, the same material as the interlayer insulation film 113 is preferably selected.

Next, as shown in FIG. 8, the insulation material 114 is polished or etched back by using CMP. The polishing and the etching back of the insulation material 114 is performed until the lower electrode 11 formed on a top surface 113b of the interlayer insulation film 113 is completely removed. Thus, the lower electrode 11 becomes a cylindrical shape, and the inner portion thereof becomes filled with the insulation material 114.

Figure 9:
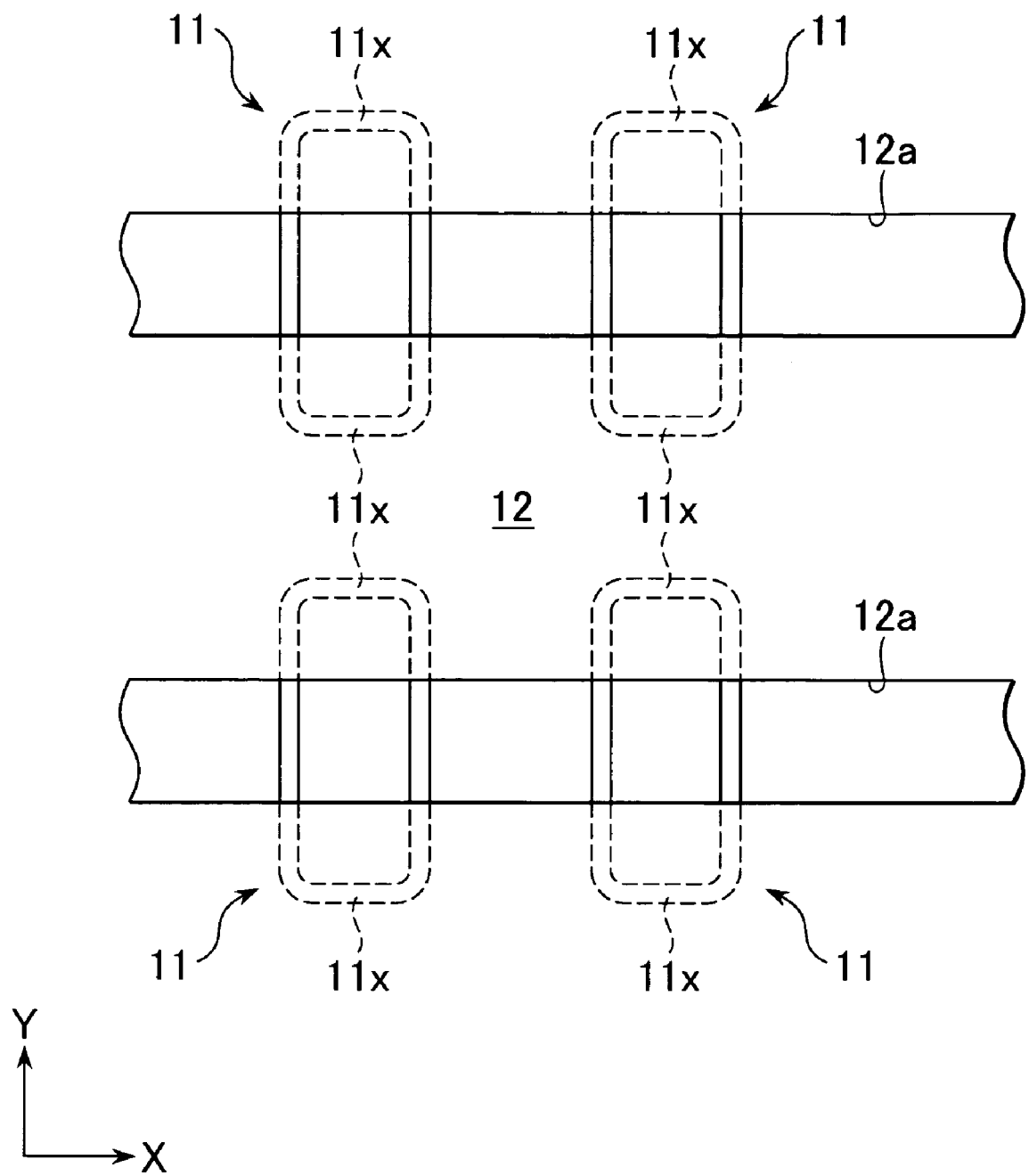
FIG. 9 is a process diagram showing a process of forming an interlayer insulation film to an aperture.

Next, as shown by a plan view in FIG. 9, after the interlayer insulation film 12 is formed on the entire surface, the interlayer insulation film 12 is patterned. Thus, a plurality of apertures 12a that extend in the X direction are formed to be in parallel to one another. The position of the aperture 12a is set to a position to traverse the strip region 11y of the lower electrode 11, that is, a position sandwiched by the two strip regions 11x. Thus, each lower electrode 11 exposes the upper surface thereof in the two regions, the region 15a and the region 15b, which are one portion of the strip region 11y.

In this case, when materials of which etching rates vary with those of the interlayer insulation film 113 and the insulation material 114 are selected as the material for the interlayer insulation film 12, it becomes possible to reduce an over-etching amount of the interlayer insulation film 113 and the insulation material 114 in an etching process at the time of forming the aperture 12a.

Since the aperture 12a extends in the X direction and the strip region 11y extends in the Y direction, the formation of the aperture 12a at a position to traverse the strip region 11y hardly causes any area variation of the regions 15a and 15b even when the formation position of the aperture 12a is slightly deviated in the Y direction.

Thereafter, the recording layer 13 and the upper electrode 14 composed of a phase change material are formed on the entire surface, and these members are collectively patterned so as to form a pattern of the recording layer 13 (recording layer pattern) and a pattern of the upper electrode 14 that extend in the Y direction. Thus, the structure shown in FIG. 1 is completed. In this case, when the patterning is performed so that the recording layer 13 and the upper electrode 14 remain on only one strip region 11y, out of two exposed strip regions 11y, the lower electrode 11 and the recording layer 13 contact in the region 15a while the lower electrode 11 and the recording layer 13 do not contact in the region 15b. That is, there is no possibility that two current paths are formed between the same lower electrode 11 and the recording layer 13. Since the recording layer 13 and the upper electrode 14 are collectively patterned, the recording layer 13 is not easily exposed to an etching environment, thereby preventing a change in the quality of the phase change material constituting the recording layer 13.

As described above, in the non-volatile semiconductor memory device according to this embodiment, the aperture 12a formed in the interlayer insulation film 12 has a successive shape that extends in the X direction, and the recording layer 13 has a successive shape that extends in the Y direction. Accordingly, occurrence of poor connection or the like caused by misalignment of the aperture 12a or the recording layer 13 can be prevented.

In this embodiment, when the formation position of the recording layer 13 is greatly deviated in the X direction, there is a possibility of occurrence of poor connection or the like. However, the recording layer 13 has a successive shape that extends in the Y direction, so that a patterning with higher accuracy is possible as compared to the case in which an island-like pattern is formed. Thus, it is possible to obtain a larger margin as compared to the conventional case.

A second preferred embodiment of the present invention will be described next.

Figure 10:
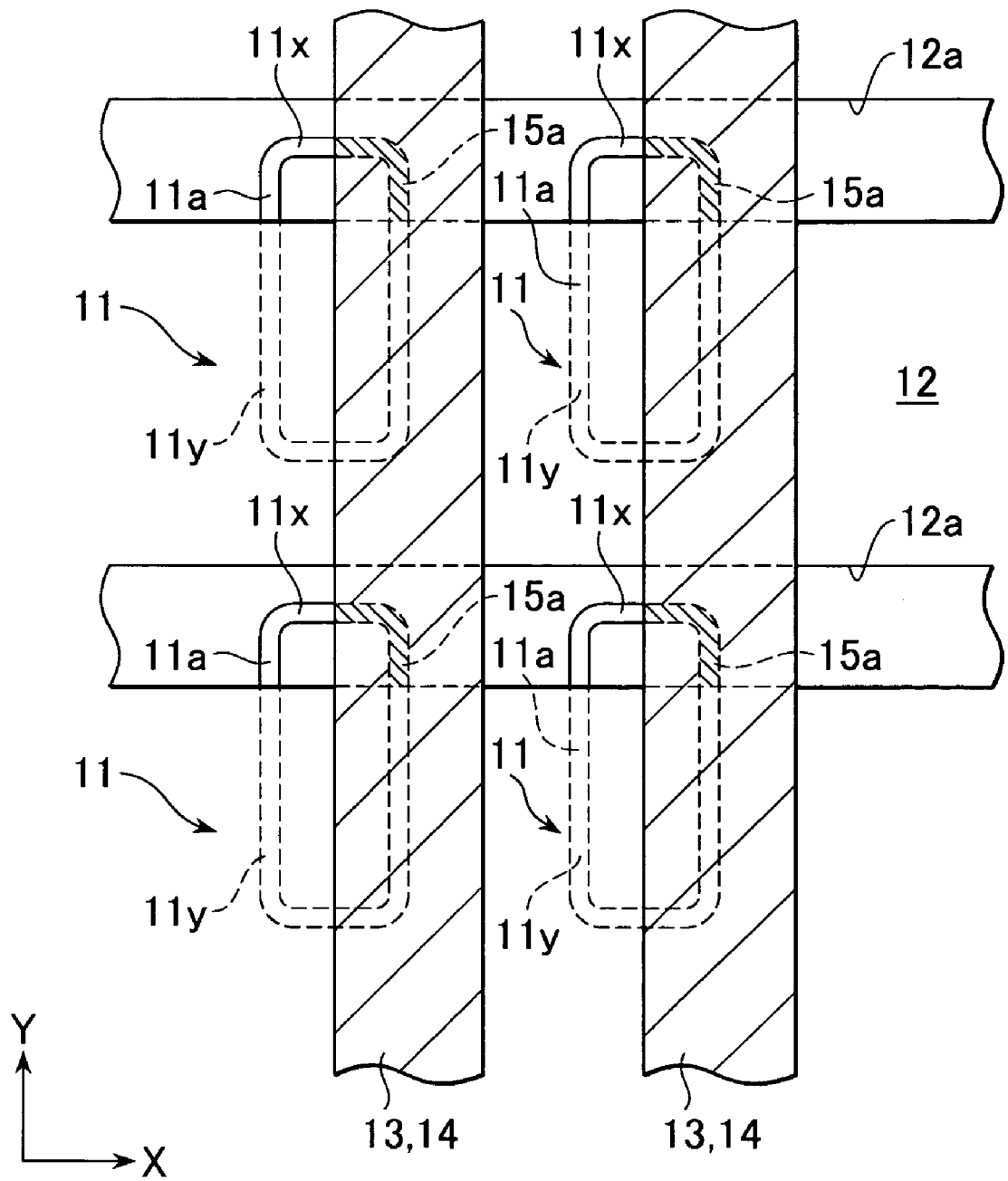
FIG. 10 is a schematic plan view of a structure of relevant parts of a non-volatile semiconductor memory device according to a second preferred embodiment of the present invention.

FIG. 10 is a schematic plan view of the structure of relevant parts of a non-volatile semiconductor memory device according to the second embodiment of the present invention.

As shown in FIG. 10, in the non-volatile semiconductor memory device according to this embodiment, the formation position of the aperture 12a is deviated in the Y direction as compared to the non-volatile semiconductor memory device shown in FIG. 1. Owing to this deviation, each lower electrode 11 exposes the top surface 11a thereof in the entire strip region 11x on one side and in a strip region 11y in the vicinity thereof. That is, in the first embodiment, the aperture 12a is formed at a position where two regions of the top surface 11a of the lower electrode 11 are exposed. On the other hand, in the second embodiment, the aperture 12a is formed at a position where only one region of the top surface 11a of the lower electrode 11 is exposed.

The formation position of the recording layer 13, however, is set on the strip regionally on one side (right side in FIG. 1), out of the two strip regions 11y of the lower electrode 11, similarly to the first embodiment. Thus, the recording layer 13 contacts only one portion out of exposed regions of the lower electrode 11. That is, the region 15a where the lower electrode 11 and the recording layer 13 contact is further limited to one portion of the top surface 11a of the lower electrode 11 exposed in the aperture 12a.

With this configuration, in the second embodiment, when the formation position of the aperture 12a in the Y direction or the formation position of the recording layer 13 in the X direction is controlled, it becomes possible to adjust the area of the region 15a. Accordingly, when the formation position of the aperture 12a in the Y direction and the formation position of the recording layer 13 in the X direction are adjusted with high accuracy, it becomes possible to make significantly small the area of the region 15 where the lower electrode 11 and the recording layer 13 contact, thereby obtaining high heating efficiency.

The present invention is in no way limited to the aforementioned embodiments, but rather various modifications are possible within the scope of the invention as recited in the claims, and naturally these modifications are included within the scope of the invention.

Figure 11:
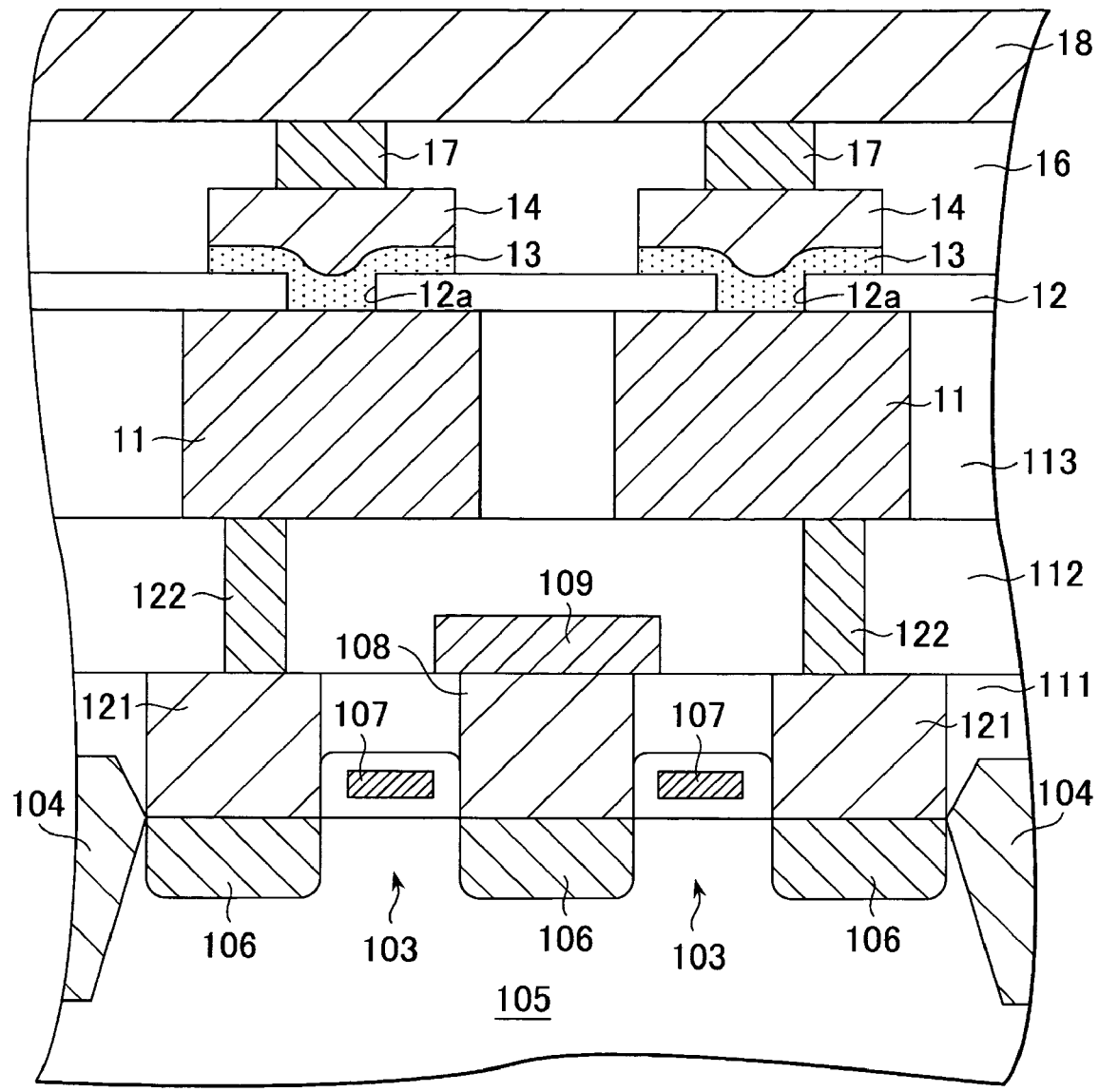
FIG. 11 is a schematic plan view of a structure of relevant parts of a non-volatile semiconductor memory device according to a modified embodiment of the present invention.
Figure 12:
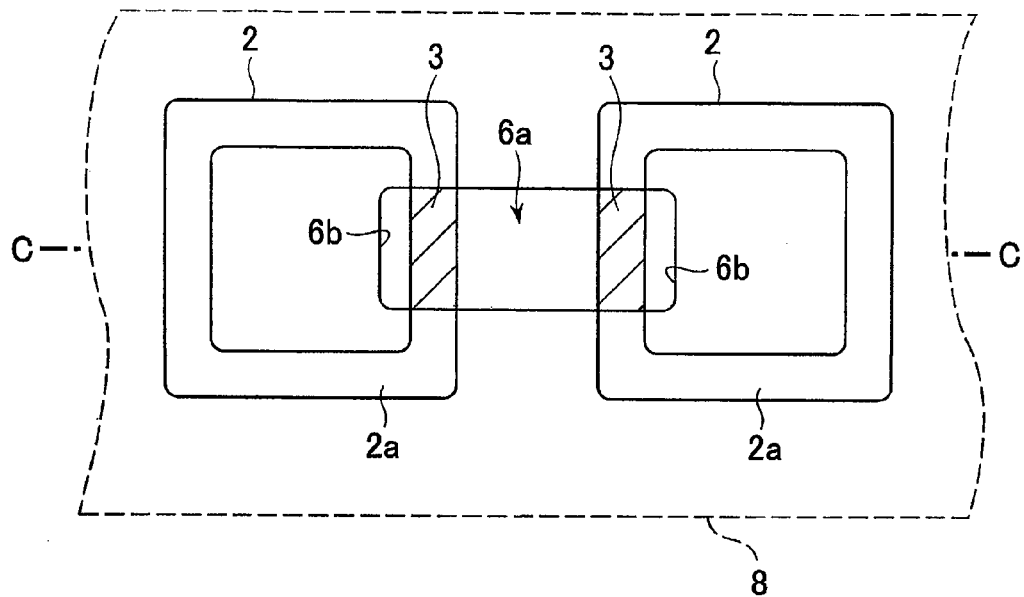
FIG. 12 is a schematic plan view of a structure of relevant parts of a conventional non-volatile semiconductor memory device.
Figure 13:
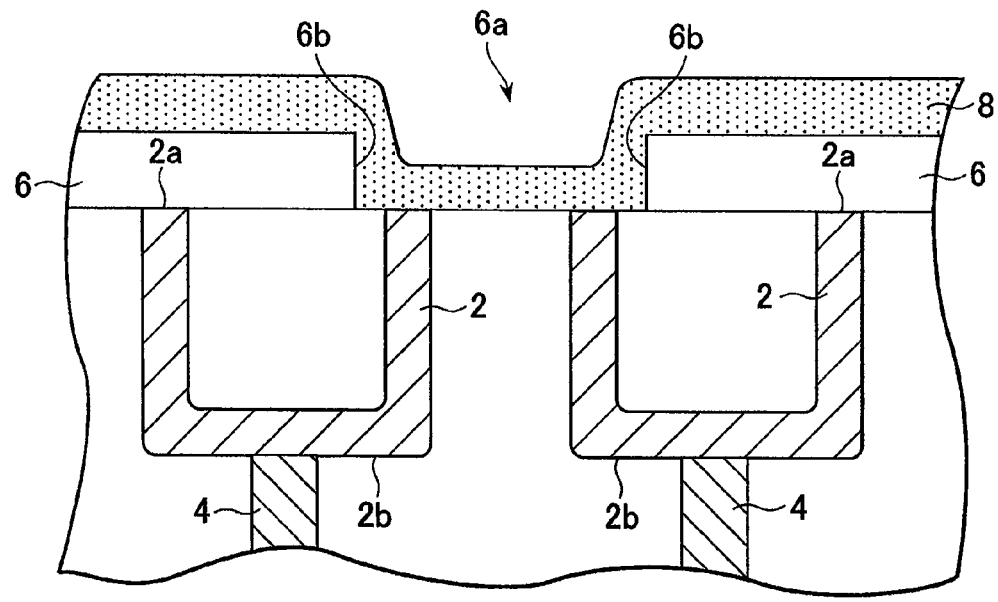
FIG. 13 is a schematic cross section taken along a line C-C shown in FIG. 12
Figure 14:
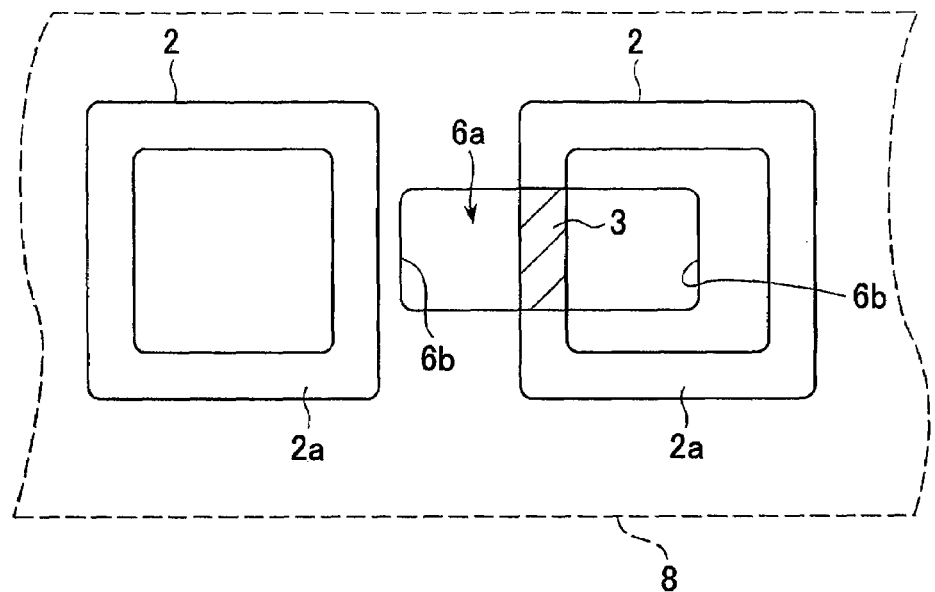
FIG. 14 is a schematic plan view for explaining a principle of occurrence of poor connection by misalignment of an aperture.
Figure 15:
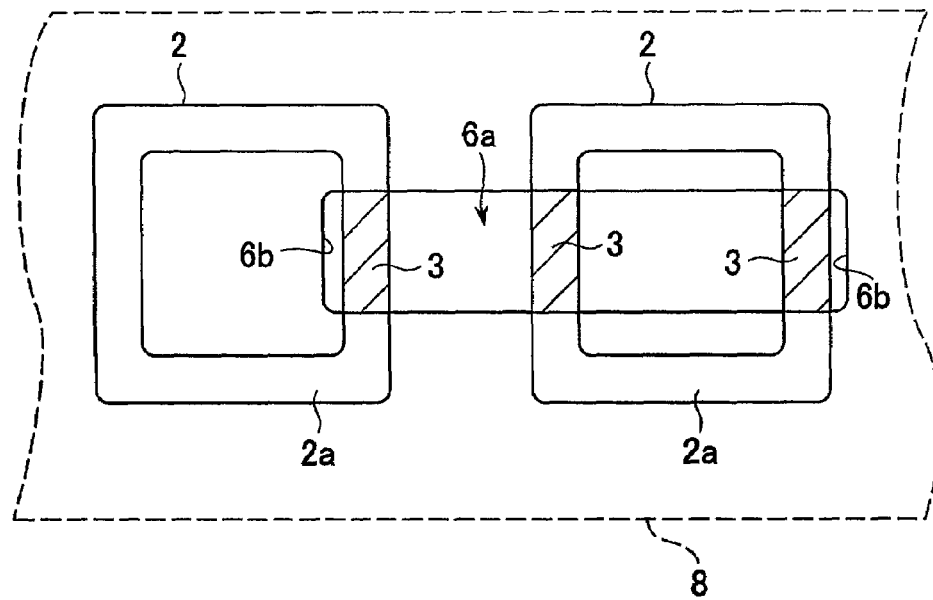
FIG. 15 is a schematic plan view for explaining a principle of formation of two current paths between the same lower electrode and a recording layer due to the misalignment of the aperture.

For example, in the above embodiment, although the recording layer 13 and the upper electrode 14 in the same row are common, these can be separated for each individual memory cell as shown in FIG. 11. In the example shown in FIG. 11, the recording layer 13 and the upper electrode 14 are separated for each memory cell, and the surrounding area thereof is covered with the interlayer insulation film 16. The upper electrode 14 is connected to the bit line 18 via the contact plug 17.

With such a configuration, it becomes possible to select, as materials for the upper electrode 14, a high resistance material similarly to the lower electrode 11, and to select, as materials for the bit line 18, metallic materials having lower electric resistance compared to that of the upper electrode 14 such as aluminum (Al), titanium, (Ti) tungsten (W), an alloy thereof, nitride thereof, and silicide, for example. Thus, radiation to the upper electrode 14 side and current loss caused by a bit line resistance can be reduced.

In each of the embodiments, the lower electrode 11 and the upper electrode 14 have a single-layered structure. These members, however, can have a multi-layered structure consisting of a plurality of conductive films. For example, a conductive film of some sort (bonding layer, for example) can exist between a main body portion of the lower electrode 11 and the recording layer 13. In this case, it can be considered that the conductive film forms one portion of the lower electrode 11. Therefore, also in this case, it can be considered that the lower electrode 11 and the recording layer 13 are contacted.

Accordingly, the non-volatile semiconductor memory device according to the present invention can obtain high heating efficiency while preventing occurrence of poor connection or the like. Therefore, it is possible to reduce a larger amount of write current as compared to the conventional case while securing a sufficient process margin. It is also possible to enhance a writing speed.

What is claimed is:

1. A non-volatile semiconductor memory device, comprising:
    a plurality of lower electrodes arranged in a matrix form having a plurality of rows and columns;
    an interlayer insulating film covering each of the lower electrodes;
    a plurality of apertures selectively formed in the interlayer insulating film, the apertures being arranged separately from one another and in parallel to one another in a column direction, each of the apertures being extended continuously in a row direction to expose respective parts of all the lower electrodes belonging to an associated one of the rows of the matrix; and
    a plurality of recording layers selectively formed over the interlayer insulating film and each containing a phase change material, the recording layers being arranged separately from one another and in parallel to one another in a row direction, each of the recording layers being extended continuously in a column direction to be in contact through the corresponding ones of the apertures with the respective parts of all the lower electrodes belonging to an associated one of the columns of the matrix.

2. The device as claimed in claim 1, wherein each of the lower electrodes has an upper surface in a ring-shape so that two portions of the upper surface being exposed through an associated one of the apertures, one of the two portions being in contact with an associated one of the recording layers with keeping the other of the two portions apart from the associated one of the recording layers.

3. The device as claimed in claim 1, wherein each of the lower electrodes has an upper surface in a ring-shape so that the part exposed through an associated one of the apertures includes two portions each including a corner of the ring-shape, one of the two portions being in contact with an associated one of the recording layers with keeping the other of the two portions apart from the associated one of the recording layers.

4. The device as claimed in claim 2, further comprising a plurality of upper electrodes each formed along an associated one of the recording layers in contact therewith.

5. The device as claimed in claim 3, further comprising a plurality of upper electrodes each formed along an associated one of the recording layers in contact therewith.

6. The device as claimed in claim 2, further comprising a plurality of memory cell transistors each having source and drain regions, one of the source and drain regions being electrically connected to an associated one of the lower electrodes.

7. The device as claimed in claim 3, further comprising a plurality of memory cell transistors each having source and drain regions, one of the source and drain regions being electrically connected to an associated one of the lower electrodes.

* * * * *